(12) United States Patent
Haba et al.

(10) Patent No.: US 8,525,314 B2
(45) Date of Patent: Sep. 3, 2013

(54) STACKED PACKAGING IMPROVEMENTS

(75) Inventors: Belgacem Haba, Saratoga, CA (US);
Craig S. Mitchell, San Jose, CA (US);
Masud Beroz, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 424 days.

(21) Appl. No.: 11/666,975

(22) PCT Filed: Nov. 3, 2005

(86) PCT No.: PCT/US2005/039716
§ 371 (c)(1),
(2), (4) Date: Aug. 25, 2008

(87) PCT Pub. No.: WO2006/052616
PCT Pub. Date: May 18, 2006

(65) Prior Publication Data
US 2009/0104736 A1    Apr. 23, 2009

Related U.S. Application Data

(60) Provisional application No. 60/624,667, filed on Nov. 3, 2004.

(51) Int. Cl.
*H01L 23/02* (2006.01)
(52) U.S. Cl.
USPC .......................................... 257/678; 438/110
(58) Field of Classification Search
USPC ................ 257/686, 700, 673, 724, 725, 678, 257/687, E21.499, 777
See application file for complete search history.

(56) References Cited

U.S. PATENT DOCUMENTS

| | | |
|---|---|---|
| 3,358,897 A | 12/1967 | Christensen |
| 3,623,649 A | 11/1971 | Keisling |
| 3,795,037 A | 3/1974 | Luttmer |
| 3,900,153 A | 8/1975 | Beerwerth et al. |
| 4,327,860 A | 5/1982 | Kirshenboin et al. |
| 4,422,568 A | 12/1983 | Elles et al. |
| 4,437,604 A | 3/1984 | Razon et al. |

(Continued)

FOREIGN PATENT DOCUMENTS

| | | |
|---|---|---|
| EP | 920058 | 6/1999 |
| EP | 2234158 A1 | 9/2010 |

(Continued)

OTHER PUBLICATIONS

Neo-Manhattan Technology, A Novel HDI Manufacturing Process, "High-Density Interconnects for Advanced Flex Substrates & 3-D Package Stacking,"IPC Flex & Chips Symposium, Tempe, AZ, Feb. 11-12, 2003.

(Continued)

*Primary Examiner* — Thao P. Le
(74) *Attorney, Agent, or Firm* — Lerner, David, Littenberg, Krumholz & Mentlik, LLP

(57) ABSTRACT

A plurality of microelectronic assemblies (60) are made by severing an in-process unit including an upper substrate (40) and lower substrate (20) with microelectronic elements (36) disposed between the substrates. In a further embodiment, a lead frame (452) is joined to a substrate (440) so that the leads project from this substrate. Lead frame (452) is joined to a further substrate (470) with one or more microelectronic elements (436, 404, 406) disposed between the substrates.

6 Claims, 5 Drawing Sheets

(56) References Cited

U.S. PATENT DOCUMENTS

| | | |
|---|---|---|
| 4,604,644 A | 8/1986 | Beckham et al. |
| 4,695,870 A | 9/1987 | Patraw |
| 4,716,049 A | 12/1987 | Patraw |
| 4,771,930 A | 9/1988 | Gillotti et al. |
| 4,793,814 A | 12/1988 | Zifcak et al. |
| 4,804,132 A | 2/1989 | DiFrancesco |
| 4,902,600 A | 2/1990 | Tamagawa et al. |
| 4,924,353 A | 5/1990 | Patraw |
| 4,975,079 A | 12/1990 | Beaman et al. |
| 4,982,265 A | 1/1991 | Watanabe et al. |
| 4,998,885 A | 3/1991 | Beaman |
| 4,999,472 A | 3/1991 | Neinast et al. |
| 5,083,697 A | 1/1992 | Difrancesco |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,214,308 A | 5/1993 | Nishiguchi et al. |
| 5,220,489 A | 6/1993 | Barreto et al. |
| 5,222,014 A | 6/1993 | Lin |
| 5,340,771 A * | 8/1994 | Rostoker .................. 29/827 |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,726,493 A | 3/1998 | Yamashita et al. |
| 5,731,709 A | 3/1998 | Pastore et al. |
| 5,736,780 A | 4/1998 | Murayama |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,831,836 A | 11/1998 | Long et al. |
| 5,854,507 A | 12/1998 | Miremadi et al. |
| 5,898,991 A | 5/1999 | Fogel et al. |
| 5,912,505 A | 6/1999 | Itoh et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,980,270 A | 11/1999 | Fjelstad et al. |
| 5,989,936 A | 11/1999 | Smith et al. |
| 5,994,152 A | 11/1999 | Khandros et al. |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,157,080 A | 12/2000 | Tamaki et al. |
| 6,158,647 A | 12/2000 | Chapman et al. |
| 6,164,523 A | 12/2000 | Fauty et al. |
| 6,177,636 B1 | 1/2001 | Fjelstad |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,215,670 B1 | 4/2001 | Khandros |
| 6,218,728 B1 | 4/2001 | Kimura |
| 6,225,688 B1 | 5/2001 | Kim et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,388,333 B1 | 5/2002 | Taniguchi et al. |
| 6,407,448 B2 | 6/2002 | Chun |
| 6,439,450 B1 | 8/2002 | Chapman et al. |
| 6,458,411 B1 | 10/2002 | Goossen et al. |
| 6,495,914 B1 | 12/2002 | Sekine et al. |
| 6,507,104 B2 | 1/2003 | Ho et al. |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,573,458 B1 | 6/2003 | Matsubara et al. |
| 6,578,754 B1 | 6/2003 | Tung |
| 6,581,283 B2 | 6/2003 | Sugiura et al. |
| 6,624,653 B1 | 9/2003 | Cram |
| 6,630,730 B2 | 10/2003 | Grigg |
| 6,647,310 B1 | 11/2003 | Yi et al. |
| 6,684,007 B2 | 1/2004 | Yoshimura et al. |
| 6,687,988 B1 | 2/2004 | Sugiura et al. |
| 6,699,730 B2 | 3/2004 | Kim et al. |
| 6,708,403 B2 | 3/2004 | Beaman et al. |
| 6,730,544 B1 | 5/2004 | Yang |
| 6,734,542 B2 | 5/2004 | Nakatani et al. |
| 6,746,894 B2 | 6/2004 | Yin et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,790,757 B1 | 9/2004 | Chittipeddi et al. |
| 6,828,668 B2 | 12/2004 | Smith et al. |
| 6,844,619 B2 | 1/2005 | Tago |
| 6,856,235 B2 | 2/2005 | Fjelstad |
| 6,867,499 B1 | 3/2005 | Tabrizi |
| 6,900,530 B1 | 5/2005 | Tsai |
| 6,902,869 B2 | 6/2005 | Appelt et al. |
| 6,930,256 B1 | 8/2005 | Huemoeller et al. |
| 6,933,608 B2 | 8/2005 | Fujisawa |
| 6,946,380 B2 | 9/2005 | Takahashi |
| 6,962,282 B2 | 11/2005 | Manansala |
| 6,962,864 B1 | 11/2005 | Jeng et al. |
| 6,987,032 B1 | 1/2006 | Fan et al. |
| 7,045,884 B2 * | 5/2006 | Standing .................. 257/678 |
| 7,061,079 B2 | 6/2006 | Weng et al. |
| 7,067,911 B1 | 6/2006 | Lin et al. |
| 7,119,427 B2 | 10/2006 | Kim |
| 7,170,185 B1 | 1/2007 | Hogerton et al. |
| 7,176,506 B2 | 2/2007 | Beroz et al. |
| 7,176,559 B2 * | 2/2007 | Ho et al. .................. 257/678 |
| 7,185,426 B1 | 3/2007 | Hiner et al. |
| 7,190,061 B2 | 3/2007 | Lee |
| 7,215,033 B2 * | 5/2007 | Lee et al. .................. 257/777 |
| 7,225,538 B2 | 6/2007 | Eldridge et al. |
| 7,227,095 B2 | 6/2007 | Roberts et al. |

| | | |
|---|---|---|
| 7,229,906 B2 | 6/2007 | Babinetz et al. |
| 7,233,057 B2 | 6/2007 | Hussa |
| 7,242,081 B1 | 7/2007 | Lee |
| 7,262,124 B2 | 8/2007 | Fujisawa |
| 7,323,767 B2 | 1/2008 | James et al. |
| 7,365,416 B2 | 4/2008 | Kawabata et al. |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |
| 7,416,107 B2 | 8/2008 | Chapman et al. |
| 7,456,091 B2 | 11/2008 | Kuraya et al. |
| 7,476,608 B2 | 1/2009 | Craig et al. |
| 7,476,962 B2 | 1/2009 | Kim |
| 7,485,562 B2 * | 2/2009 | Chua et al. ................... 438/613 |
| 7,495,342 B2 | 2/2009 | Beaman et al. |
| 7,517,733 B2 | 4/2009 | Camacho et al. |
| 7,538,565 B1 | 5/2009 | Beaman et al. |
| 7,576,439 B2 | 8/2009 | Craig et al. |
| 7,578,422 B2 | 8/2009 | Lange et al. |
| 7,621,436 B2 | 11/2009 | Mii et al. |
| 7,633,765 B1 | 12/2009 | Scanlan et al. |
| 7,646,102 B2 | 1/2010 | Boon |
| 7,671,457 B1 | 3/2010 | Hiner et al. |
| 7,671,459 B2 * | 3/2010 | Corisis et al. ................. 257/686 |
| 7,675,152 B2 | 3/2010 | Gerber et al. |
| 7,677,429 B2 | 3/2010 | Chapman et al. |
| 7,682,962 B2 | 3/2010 | Hembree |
| 7,728,443 B2 | 6/2010 | Hembree |
| 7,737,545 B2 | 6/2010 | Fjelstad et al. |
| 7,757,385 B2 | 7/2010 | Hembree |
| 7,777,351 B1 | 8/2010 | Berry et al. |
| 7,780,064 B2 | 8/2010 | Wong et al. |
| 7,808,093 B2 | 10/2010 | Kagaya et al. |
| 7,842,541 B1 | 11/2010 | Rusli et al. |
| 7,850,087 B2 | 12/2010 | Hwang et al. |
| 7,855,462 B2 | 12/2010 | Boon et al. |
| 7,880,290 B2 | 2/2011 | Park |
| 7,892,889 B2 | 2/2011 | Howard et al. |
| 7,919,846 B2 | 4/2011 | Hembree |
| 7,934,313 B1 * | 5/2011 | Lin et al. ........................ 29/841 |
| 7,964,956 B1 | 6/2011 | Bet-Shliemoun |
| 7,967,062 B2 | 6/2011 | Campbell et al. |
| 7,977,597 B2 | 7/2011 | Roberts et al. |
| 8,012,797 B2 * | 9/2011 | Shen et al. .................... 438/107 |
| 8,020,290 B2 | 9/2011 | Sheats |
| 8,039,970 B2 | 10/2011 | Yamamori et al. |
| 8,071,470 B2 | 12/2011 | Khor et al. |
| 8,084,867 B2 | 12/2011 | Tang et al. |
| 8,093,697 B2 | 1/2012 | Tessera |
| 8,213,184 B2 | 7/2012 | Knickerbocker |
| 8,232,141 B2 | 7/2012 | Choi et al. |
| 2001/0002607 A1 | 6/2001 | Sugiura et al. |
| 2001/0007370 A1 | 7/2001 | Distefano |
| 2001/0028114 A1 | 10/2001 | Hosomi |
| 2002/0014004 A1 | 2/2002 | Beaman et al. |
| 2002/0066952 A1 * | 6/2002 | Taniguchi et al. ............. 257/698 |
| 2002/0117330 A1 | 8/2002 | Eldridge et al. |
| 2002/0125571 A1 | 9/2002 | Corisis et al. |
| 2002/0153602 A1 | 10/2002 | Tay et al. |
| 2002/0164838 A1 | 11/2002 | Moon et al. |
| 2002/0185735 A1 | 12/2002 | Sakurai et al. |
| 2003/0006494 A1 | 1/2003 | Lee et al. |
| 2003/0048108 A1 | 3/2003 | Beaman et al. |
| 2003/0057544 A1 * | 3/2003 | Nathan et al. ................. 257/700 |
| 2003/0106213 A1 | 6/2003 | Beaman et al. |
| 2003/0124767 A1 | 7/2003 | Lee et al. |
| 2003/0162378 A1 | 8/2003 | Mikami |
| 2003/0164540 A1 | 9/2003 | Lee et al. |
| 2004/0036164 A1 * | 2/2004 | Koike et al. ................... 257/723 |
| 2004/0038447 A1 | 2/2004 | Corisis et al. |
| 2004/0075164 A1 | 4/2004 | Pu et al. |
| 2004/0090756 A1 * | 5/2004 | Ho et al. ....................... 361/767 |
| 2004/0110319 A1 | 6/2004 | Fukutomi et al. |
| 2004/0119152 A1 | 6/2004 | Karnezos et al. |
| 2004/0124518 A1 | 7/2004 | Karnezos |
| 2004/0148773 A1 | 8/2004 | Beaman et al. |
| 2004/0152292 A1 | 8/2004 | Babinetz et al. |
| 2004/0160751 A1 * | 8/2004 | Inagaki et al. ................. 361/763 |
| 2004/0188499 A1 | 9/2004 | Nosaka |
| 2004/0262734 A1 | 12/2004 | Yoo |
| 2005/0035440 A1 | 2/2005 | Mohammed |
| 2005/0062492 A1 | 3/2005 | Beaman et al. |
| 2005/0082664 A1 * | 4/2005 | Funaba et al. ................. 257/724 |
| 2005/0095835 A1 | 5/2005 | Humpston et al. |
| 2005/0116326 A1 | 6/2005 | Haba et al. |
| 2005/0133916 A1 | 6/2005 | Karnezos |
| 2005/0133932 A1 | 6/2005 | Pohl et al. |
| 2005/0140265 A1 | 6/2005 | Hirakata |
| 2005/0151235 A1 | 7/2005 | Yokoi |
| 2005/0151238 A1 | 7/2005 | Yamunan |
| 2005/0173805 A1 | 8/2005 | Damberg et al. |
| 2005/0173807 A1 * | 8/2005 | Zhu et al. ...................... 257/777 |
| 2005/0181544 A1 | 8/2005 | Haba et al. |
| 2005/0181655 A1 | 8/2005 | Haba et al. |
| 2005/0212109 A1 * | 9/2005 | Cherukuri et al. ............ 257/686 |
| 2005/0266672 A1 | 12/2005 | Jeng et al. |
| 2005/0285246 A1 | 12/2005 | Haba et al. |
| 2006/0118641 A1 | 6/2006 | Hwang et al. |
| 2006/0166397 A1 | 7/2006 | Lau et al. |
| 2006/0197220 A1 | 9/2006 | Beer |
| 2006/0278682 A1 | 12/2006 | Lange et al. |
| 2007/0015353 A1 | 1/2007 | Craig et al. |
| 2007/0148822 A1 | 6/2007 | Haba et al. |
| 2007/0181989 A1 * | 8/2007 | Corisis et al. ................. 257/686 |
| 2007/0190747 A1 | 8/2007 | Humpston et al. |
| 2007/0271781 A9 | 11/2007 | Beaman et al. |
| 2007/0290325 A1 | 12/2007 | Wu et al. |
| 2008/0017968 A1 | 1/2008 | Choi et al. |
| 2008/0032519 A1 | 2/2008 | Murata |
| 2008/0047741 A1 | 2/2008 | Beaman et al. |
| 2008/0048309 A1 | 2/2008 | Corisis et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073771 A1 | 3/2008 | Seo et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0211084 A1 * | 9/2008 | Chow et al. ................... 257/700 |
| 2008/0284045 A1 | 11/2008 | Gerber et al. |
| 2008/0303153 A1 * | 12/2008 | Oi et al. ........................ 257/738 |
| 2008/0315385 A1 | 12/2008 | Gerber et al. |
| 2009/0050994 A1 | 2/2009 | Ishihara et al. |
| 2009/0085185 A1 | 4/2009 | Byun et al. |

| | | | |
|---|---|---|---|
| 2009/0085205 A1 | 4/2009 | Sugizaki | |
| 2009/0091009 A1 | 4/2009 | Corisis et al. | |
| 2009/0102063 A1 | 4/2009 | Lee et al. | |
| 2009/0104736 A1 | 4/2009 | Haba et al. | |
| 2009/0127686 A1 | 5/2009 | Yang et al. | |
| 2009/0128176 A1 | 5/2009 | Beaman et al. | |
| 2009/0160065 A1 | 6/2009 | Haba et al. | |
| 2009/0189288 A1 | 7/2009 | Beaman et al. | |
| 2009/0206461 A1 | 8/2009 | Yoon | |
| 2009/0212442 A1 | 8/2009 | Chow et al. | |
| 2009/0236700 A1 | 9/2009 | Moriya | |
| 2009/0236753 A1 | 9/2009 | Moon et al. | |
| 2009/0261466 A1 | 10/2009 | Pagaila et al. | |
| 2009/0315579 A1 | 12/2009 | Beaman et al. | |
| 2010/0007009 A1 | 1/2010 | Chang et al. | |
| 2010/0025835 A1 | 2/2010 | Oh et al. | |
| 2010/0052135 A1 | 3/2010 | Shim et al. | |
| 2010/0078789 A1* | 4/2010 | Choi et al. | 257/686 |
| 2010/0078795 A1 | 4/2010 | Dekker et al. | |
| 2010/0090330 A1 | 4/2010 | Nakazato | |
| 2010/0117212 A1 | 5/2010 | Corisis et al. | |
| 2010/0133675 A1 | 6/2010 | Yu et al. | |
| 2010/0224975 A1 | 9/2010 | Shin et al. | |
| 2010/0232129 A1 | 9/2010 | Haba et al. | |
| 2010/0314748 A1 | 12/2010 | Hsu et al. | |
| 2011/0272449 A1 | 11/2011 | Pirkle et al. | |
| 2012/0043655 A1 | 2/2012 | Khor et al. | |
| 2012/0119380 A1 | 5/2012 | Haba | |

FOREIGN PATENT DOCUMENTS

| | | |
|---|---|---|
| JP | 61125062 A | 6/1986 |
| JP | 62-226307 | 10/1987 |
| JP | 1012769 A | 1/1989 |
| JP | 64-71162 | 3/1989 |
| JP | 62-68015 A | 9/1994 |
| JP | 6268015 * | 9/1994 |
| JP | 07-122787 A | 5/1995 |
| JP | 11-074295 A | 3/1999 |
| JP | 11135663 A | 5/1999 |
| JP | 2001196407 A | 7/2001 |
| JP | 2003122611 A | 4/2003 |
| JP | 2003-174124 | 6/2003 |
| JP | 2003307897 A | 10/2003 |
| JP | 2004327856 A | 11/2004 |
| JP | 2004343030 A | 12/2004 |
| JP | 2003377641 A | 6/2005 |
| JP | 2005142378 A | 6/2005 |
| JP | 2003426392 A | 7/2005 |
| JP | 2005183880 A | 7/2005 |
| JP | 2007123595 A | 5/2007 |
| JP | 2009004650 A | 1/2009 |
| JP | 2009260132 A | 11/2009 |
| JP | 2010103129 A | 5/2010 |
| JP | 2010206007 A | 9/2010 |
| KR | 100265563 | 9/2000 |
| KR | 2001-0094894 A | 11/2001 |
| KR | 10-0393102 | 7/2002 |
| KR | 20020058216 A | 7/2002 |
| KR | 20060064291 A | 6/2006 |
| KR | 20080020069 A | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20100033012 A | 3/2010 |
| KR | 20100062315 A | 6/2010 |
| KR | 101011863 | 1/2011 |
| WO | 02/13256 A1 | 2/2002 |

OTHER PUBLICATIONS

North Corporation, "Processed Intra-layer Interconnection Material for PWBs [Etched Copper Bump with Copper Foil]," NMBITM, Version 2001.6.
Kim et al., "Application of Through Mold Via (TMV) as PoP base package", 6 pages, (2008).
Kim, et al., Application of Through Mold Via (TMV) as PoP base package, ECTC, 2008.
Bang, U.S. Appl. No. 10/656,534, filed Sep. 5, 2003.
International Search Report and Written Opinion for Application No. PCT/US2011/044346 dated May 11, 2012.
International Search Report and Written Opinion PCT/US2011/044342 dated May 7, 2012.
Korean Search Report KR10-2011-0041843 dated Feb. 24, 2011.
Partial International Search Report from Invitation to Pay Additional Fees for Application No. PCT/US2012/028738 dated Jun. 6, 2012.
"EE Times Asia" [online]. [Retrieved Aug. 5, 2010]. Retrieved from internet. <http://www.eetasia.com/ART_8800428222_480300_nt_dec52276.HTM>, 4 pages.
"Wafer Level Stack—WDoD", [online]. [Retrieved Aug. 5, 2010]. Retrieved from the internet. <http://www.3d-plus.com/techno-wafer-level-stack-wdod.php>, 2 pages.
International Seacrh Report and Written Opinion for Application No. PCT/US2012/060402 dated Apr. 2, 2013.
International Search Report and Written Opinion for PCT/US2011/060551 dated Apr. 18, 2012.
Jin, Yonggang et al., "STM 3D-IC Package and 3D eWLB Development," STMicroelectronics Singapore/STMicroelectronics France.
Meiser S, "Klein UND Komplex", Elektronik, IRL Press Limited, DE, vol. 41, No. 1, Jan. 7, 1992, pp. 72-77, XP000277326. (International Search Report for Application No. PCT/US2012/060402 dated Feb. 21, 2013 provides concise statement of relevance.).
Partial International Search Report for Application No. PCT/US2012/060402 dated Feb. 21, 2013.
Redistributed Chip Package (RCP) Technology, Freescale Semiconductor, 2005, 6 pages.
Search Report from Korean Patent Applicatin No. 10-2010-0113271 dated Jan. 12, 2011.
Yoon, PhD, Seung Wook, "Next Generation Wafer Level Packaging Solution for 3D integration," May 2010, Stats ChipPAC Ltd.

* cited by examiner

STACKED PACKAGING IMPROVEMENTS

CROSS-REFERENCE TO RELATED APPLICATIONS

The present application claims the priority of the filing date of U.S. Provisional Patent Application No. 60/624,667, filed Nov. 3, 2004, the disclosure of which is hereby incorporated by reference herein.

BACKGROUND OF THE INVENTION

Microelectronic elements such as semiconductor chips typically are provided in packages which provide physical and chemical protection for the semiconductor chip or other microelectronic element. Such a package typically includes a package substrate such as a small circuit panel formed from a dielectric material and having electrically conductive terminals thereon. The chip is mounted on the panel and electrically connected to the terminals of the package substrate. Typically, the chip and portions of the substrate are covered by an encapsulant or overmolding, so that only the terminal-bearing outer surface of the substrate remains exposed. Such a package can be readily shipped, stored and handled. The package can be mounted to a larger circuit panel such as a circuit board using standard mounting techniques, most typically surface-mounting techniques. Considerable effort has been devoted in the art to making such packages smaller, so that the packaged chip occupies a smaller area on the circuit board. For example, packages referred to as chip-scale packages occupy an area of the circuit board equal to the area of the chip itself, or only slightly larger than the area of the chip itself. However, even with chip-scale packages, the aggregate area occupied by several packaged chips is greater than or equal to the aggregate area of the individual chips.

It has been proposed to provide "stacked" packages, in which a plurality of chips are mounted one above the other in a common package. This common package can be mounted on an area of the circuit panel which may be equal to or just slightly larger than the area typically required to mount a single package containing a single chip. The stacked package approach conserves space on the circuit panel. Chips or other elements which are functionally related to one another can be provided in a common stacked package. The package may incorporate interconnections between these elements. Thus, the main circuit panel to which the package is mounted need not include the conductors and other elements required for these interconnections. This, in turn, allows use of a simpler circuit panel and, in some cases, allows the use of a circuit panel having fewer layers of metallic connections, thereby materially reducing the cost of the circuit panel. Moreover, the interconnections within a stacked package often can be made with lower electrical impedance and shorter signal propagation delay times than comparable interconnections between individual packages mounted on a circuit panel. This, in turn, can increase the speed of operation of the microelectronic elements within the stacked package as, for example, by allowing the use of higher clock speeds in signal transmissions between these elements.

One form of stacked package which has been proposed heretofore is sometimes referred to as a "ball stack." A ball stack package includes two or more individual units. Each unit incorporates a unit substrate similar to the package substrate of an individual package, and one or more microelectronic elements mounted to the unit substrate and connected to the terminals on the unit substrate. The individual units are stacked one above the other, with the terminals on each individual unit substrate being connected to terminals on another unit substrate by electrically conductive elements such as solder balls or pins. The terminals of the bottom unit substrate may constitute the terminals of the package or, alternatively, an additional substrate may be mounted at the bottom of the package and may have terminals connected to the terminals of the various unit substrates. Ball stack packages are depicted, for example, in certain preferred embodiments of U.S. Published Patent Applications 2003/0107118 and 2004/0031972, the disclosures of which are hereby incorporated by reference herein.

In another type of stack package sometimes referred to as a fold stack package, two or more chips or other microelectronic elements are mounted to a single substrate. This single substrate typically has electrical conductors extending along the substrate to connect the microelectronic elements mounted on the substrate with one another. The same substrate also has electrically conductive terminals which are connected to one or both of the microelectronic elements mounted on the substrate. The substrate is folded over on itself so that a microelectronic element on one portion lies over a microelectronic element on another portion, and so that the terminals of the package substrate are exposed at the bottom of the folded package for mounting the package to a circuit panel. In certain variants of the fold package, one or more of the microelectronic elements is attached to the substrate after the substrate has been folded to its final configuration. Examples of fold stacks are shown in certain preferred embodiments of U.S. Pat. No. 6,121,676; U.S. patent application Ser. No. 10/077,388; U.S. patent application Ser. No. 10/655,952; U.S. Provisional Patent Application No. 60/403,939; U.S. Provisional Patent Application No. 60/408,664; and U.S. Provisional Patent Application No. 60/408,644. Fold stacks have been used for a variety of purposes, but have found particular application in packaging chips which must communicate with one another as, for example, in forming assemblies incorporating a baseband signal processing chip and radiofrequency power amplifier ("RFPA") chip in a cellular telephone, so as to form a compact, self-contained assembly.

Despite all of these efforts in the art, still further improvement would be desirable. In particular, it would be desirable to provide packages which can afford advantages similar to those achieved in a fold stack without the necessity for actually folding a substrate.

SUMMARY OF THE INVENTION

One aspect of the invention provides a method of making a plurality of microelectronic assemblies. The method according to this aspect of the invention desirably includes the steps of providing an in-process unit including a plurality of microelectronic elements, a least one upper substrate extending above the microelectronic elements and at least one lower substrate extending below the microelectronic elements, at least one of these substrates including a plurality of regions; and then severing the in-process unit to form individual units, each said unit including a region of each of said at least one of said substrates and at least one of said microelectronic elements.

A further aspect of the invention provides an in-process unit. The in-process unit according to this aspect of the invention desirably includes upper and lower substrates and a plurality of microelectronic, elements disposed between the substrates. Each substrate preferably includes a plurality of regions, each region of the upper substrate being aligned with a corresponding region of the lower substrate with at least one said microelectronic element disposed therebetween. Preferably, each of the regions of said upper and lower substrates have electrically conductive elements, at least some of said conductive elements of each region of the upper substrate being electrically connected to electrically conductive elements of the corresponding region of said lower substrate.

Yet another aspect of the invention provides a method of making a microelectronic assembly. The method according to this aspect of the invention desirably includes attaching a lead frame to a first substrate so that leads of the lead frame project from such substrate and assembling the first substrate with a second substrate so that at least one microelectronic element is disposed between the first and second substrates, and connecting said leads to said second substrate.

DETAILED DESCRIPTION

Figure 1:
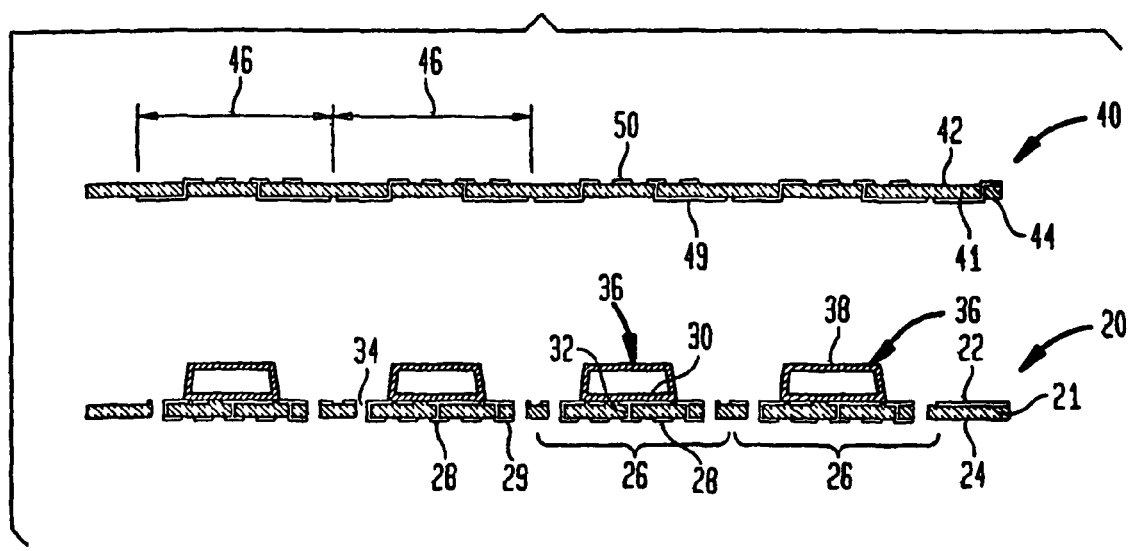
FIG. 1 is a diagrammatic sectional view depicting elements utilized in a process according to one embodiment of the invention.
Figure 2:
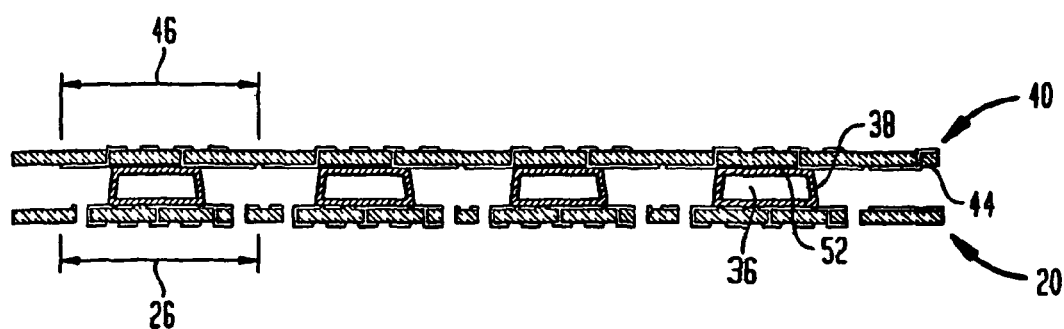
FIGS. 2-6 are views similar to FIG. 1, but depicting the elements at progressively later stages of the same process.

An assembly method in accordance with one embodiment of the invention utilizes a substrate referred to herein for purposes of convenience as the lower substrate 20 incorporating a dielectric layer 21 defining an upper surface 22 and a lower surface 24. The lower substrate 20 typically is in the form of a continuous or semicontinuous tape or sheet having a large number of regions 26. As explained below, each region 26 will constitute a portion of an individual package at the end of the process, and each region 26 includes the features which, as discussed below, will form a part of a single package.

Dielectric layer 21 may be a single layer, or may be a laminate including several sublayers. The dielectric layer desirably is formed primarily from polymeric dielectrics such as polyimide, BT resin, epoxy or other dielectric polymers, and may include reinforcing fibers as, for example, glass fibers. Dielectric layer 21 may be flexible or rigid. Lower substrate 20 includes mounting terminals 28, and later interconnect terminals 29, exposed at the lower surface 24 of the dielectric layer and conductive connection elements 30 exposed at the upper surface 22. In the particular embodiment depicted, terminals 28 and 29 are formed in a layer separate from connection elements 30, these layers being separated from one another by dielectric layer 21 and electrically connected to one another by conductive elements such as vias 32 extending through the dielectric layer. Such an arrangement is commonly referred to as a "two-metal" structure. However, lower substrate 20 can be formed as a single metal structure with a single metal layer constituting conductive connection elements 30 as well as terminals 28 and 29. For example, such a layer may be disposed on the bottom surface 24 of the dielectric layer, with the conductive connection elements 30 exposed at the top surface 22 through holes (not shown) in the dielectric layer. Similarly, such a single metal layer may be disposed on the upper surface 22, with the terminals 28 and 29 being exposed at the lower surface 24 through holes (not shown) in the dielectric layer. In still further alternatives, one or more metallic layers constituting the conductive mounting elements, the terminals or both can be disposed within the thickness of the dielectric layer and exposed through holes to the appropriate surfaces.

Lower substrate 20 has apertures 34 extending through the dielectric layer, from the upper surface to the lower surface. Apertures 34 may be in the form of individual holes or elongated slots. Apertures 34 are disposed in the vicinity of interlayer connection terminals 29. Microelectronic elements 36 are mounted on the upper surface 22 of lower substrate 20. Each region 26 has one or more of the microelectronic elements mounted thereon. In the particular embodiment illustrated, each region 26 of the lower substrate bears one microelectronic element. The microelectronic elements shown are semiconductor chips mounted in a face-down orientation, with the contacts (not shown) of the chip connected to the conductive connection elements 30 of the substrate as, for example, by bonding the contacts to the conductive mounting elements using a bonding material such as a solder. However, other techniques can be employed. For example, each microelectronic element 36 may be a packaged microelectronic element incorporating a package substrate (not shown) with terminals thereon, these terminals being connected to the conductive connection elements 30 on the lower substrate. In still other variants, techniques such as anisotropic conductive adhesives can be employed. An overmolding 38 covers the exposed surfaces of each microelectronic element 36. In other embodiments, overmolding 38 is omitted. The microelectronic element 36 within each region 26 of the lower substrate is electrically connected through the conductive connection elements 30 of that region to at least some of the mounting terminals 28 of the same region, to at least some of the interlayer connection terminals 29 of that region or both. Microelectronic elements 36 may be mounted on the lower substrate using conventional techniques, either as part of the assembly process described herein or in a separate operation used to prepare the lower substrate 20.

The process according to this embodiment of the invention also uses an upper substrate 40 including a dielectric layer 41, which may be formed from the same materials as discussed above in connection with the lower dielectric layer, defining an upper surface 42 and a lower surface 44. The upper substrate has layer interlayer connection terminals 49 exposed at lower surface 44, and conductive mounting terminals 50 exposed at the upper surface. Here again, these features are shown as a two-layer structure, but can be formed from a single layer or multiple layers with the features exposed to one or both of the surfaces through holes in the dielectric layer. The upper substrate 40 also has a plurality of regions 46, each such region including a set of interlayer connection terminals 49 and a set of mounting terminals 50, at least some mounting terminals 50 electrically connected to at least some interlayer connection terminals 49 of the same region.

In the assembly process, lower substrate 20 with microelectronic elements 36 thereon is united with upper substrate 40, so that the lower surface 44 of the upper substrate 40 rests on the microelectronic elements 36 and faces toward the lower substrate. Thus, the microelectronic elements 36 are positioned between the substrates. An adhesive 52 may be applied on the lower surface 44 of the upper substrate on the surfaces of microelectronic elements 36 remote from the lower substrate, which surfaces may be the surfaces defined by the encapsulant 38 surrounding each microelectronic element. The process of assembling the substrates to one another most preferably is conducted while both substrates remain in the form of large substrates incorporating plural regions 26 and 46. For example, where the substrates are in the form of elongated tapes or strips, the substrates may be advanced through a pair of nip rollers or through a press, so as to bring the upper substrate into engagement with the surfaces of microelectronic elements 36 on the lower substrate. Alternatively, where both substrates are in the form of large sheets, such as large circular or square sheets, the assembly process may be conducted simply by laying one sheet onto the other sheet, so as to assemble the substrate with one another. The substrates are assembled with one another so that each region 46 of the upper substrate 20 is aligned with a corresponding region 26 of the lower substrate 20.

After assembling the substrates with one another, the layer interconnect terminals 29 in each region of the lower substrate are connected to the layer interconnect terminals 49 of the corresponding region on the upper substrate. This connection is made by applying wire bonds 53 between the layer interconnect terminals. The wire bonds extend through the apertures 34 in the lower substrate. After wire-bonding, at least some of the lower mounting terminals 28, or at least some contacts on the chip 36 associated with each lower region, are connected to at least some of the mounting terminals 50 on the corresponding region of the upper substrate through the wire bonds and layer interconnect terminals.

Figure 3:
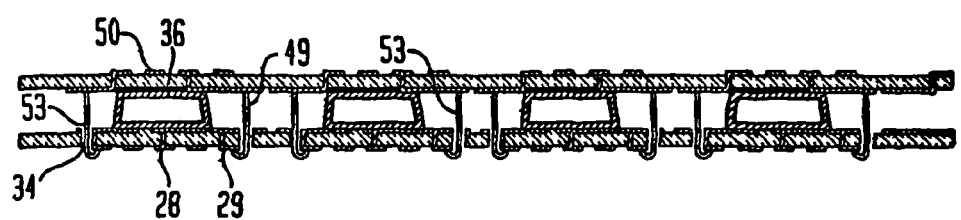
Figure 4:
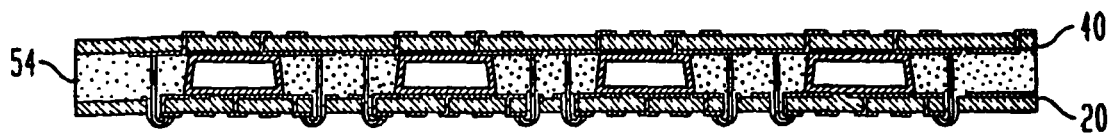

Following application of the wire bonds, an encapsulant 54 is introduced between the lower substrate 20 and upper substrate 40 (FIG. 4). The encapsulant may be any flowable encapsulant compatible with the materials of construction. Most desirably, the encapsulant 54 is a settable material which, in an uncured state, is a liquid having a relatively low viscosity, and which can be cured to a solid or semisolid condition. Examples of such materials include epoxies, silicones and other materials commonly employed as encapsulants in microelectronic packages. These materials cure by chemical reaction, typically promoted by application of heat. Other encapsulants such as thermoplastic materials which liquify upon heating, and cure to a solid condition by cooling, can be used. The encapsulant can be injected between the substrates by any suitable process. During injection of the encapsulant, some encapsulant may escape through the apertures 34 (FIG. 3) in the lower substrate. The substrates may be constrained between elements of a mold or other fixture during injection of the encapsulant, and these elements may seal the openings 34 in the upper substrate. Alternatively or additionally, the openings 34 in the lower substrate may be covered by dielectric film such as a solder mask applied over the openings after wire-bonding. The techniques taught in commonly assigned U.S. Pat. Nos. 6,329,224 and 5,766,987, the disclosures of which are hereby incorporated by reference herein, may be employed in this step. The encapsulant injection step desirably is also performed while the substrates 40 and 20 remain in their original form, with the various regions of each substrate remaining connected to one another at this stage. The encapsulant surrounds the wire bonds 53 (FIG. 3) and desirably substantially or completely fills the space between the upper and lower substrate, other than the spaces occupied by the microelectronic elements themselves.

After injection and curing of the encapsulant, one or more additional microelectronic elements 56 are mounted on the exposed top surface 42 of upper substrate 40, and electrically connected to the mounting terminals 50 of the upper substrate. Here again, the microelectronic elements 56 are mounted to the various regions 46 of the upper substrate. Electrically conductive bonding materials such as solder balls 58 may be applied on the mounting terminals 28 of the lower substrate. The additional microelectronic elements 56 may be "bare" or unpackaged semiconductor chips or other microelectronic elements, or may be packaged microelectronic elements such as packaged semiconductor chips. In the embodiments depicted, each additional microelectronic element is mounted by directly bonding contacts on the microelectronic element to the mounting elements 50 of the upper substrate. However, other mounting and connection techniques can be used. For example, in a variant, the additional microelectronic element 56 may be mounted in a "face-up" disposition on the upper substrate and connected by wire bonds to the mounting elements 50. Also, an encapsulant or other cover may be applied over the additional microelectronic elements.

Figure 6:
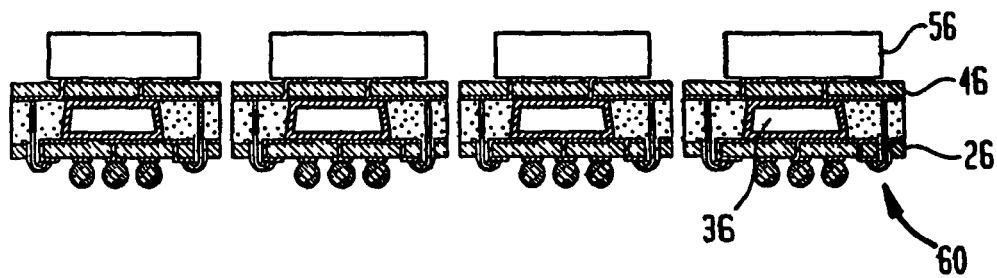

After mounting the additional microelectronic elements 56 and the conductive bonding materials 58, the upper and lower substrates are severed to form individual units 60 (FIG. 6). Each such unit includes one region 26 of the lower substrate and the corresponding region 46 of the upper substrate, together with the microelectronic 36 on the lower substrate and additional microelectronic element 56 on the upper substrate. Each such unit is a self-contained stacked package. Each unit 60 forms a complete stacked package, with one or more additional microelectronic elements 56 connected to one or more microelectronic elements 36. Such a package can be mounted on a circuit board or other larger substrate in substantially the same way as a conventional single element microelectronic package.

In a variant of the process discussed above, the additional microelectronic elements 56, connective bonding materials 58 or both can be mounted to the substrates after severance. The assembled substrates or microelectronic elements 36, with or without the bonding materials 58, in either the unsevered condition or as separate, severed units, can be handled, shipped and stocked as semifinished articles of commerce. Such an arrangement can be used, for example, where the same microelectronic elements 36 are to, be incorporated into a large number of packages, but different additional elements 56 are used in different ones of the packages.

In yet another variant, the encapsulant 54 may be omitted. In this variant, the microelectronic elements 36 disposed between the substrates provide structural support. Additional structural support may be provided between the substrates by providing spacers extending between the dielectric elements at locations not occupied by microelectronic elements 36 or wire bonds 53.

Figure 5:
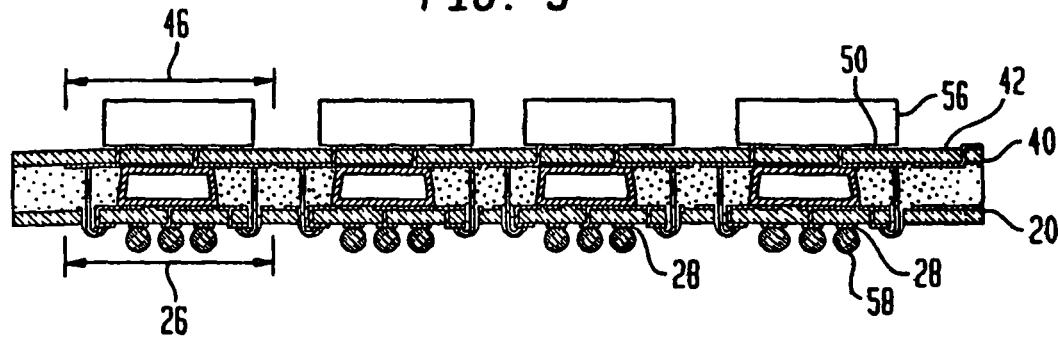
Figure 7:
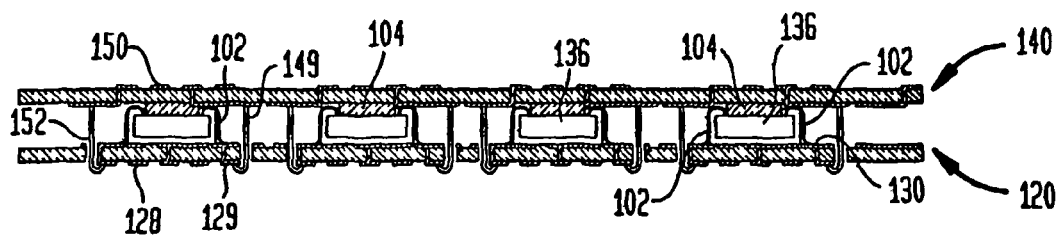
FIG. 7 is a diagrammatic sectional view of elements used in a process according to a further embodiment of the invention.

A process according to a further embodiment of the invention uses a lower substrate 120 and upper substrate 140 similar to those discussed above with reference to FIGS. 1-6. However, the microelectronic elements 136 mounted on lower substrate 120 are mounted in "face-up" disposition, without overmolding. The contacts on the microelectronic elements 136 are electrically connected to the conductive mounting elements 130 on the upper surface of lower substrate 120 by wire bonds 102 before assembly of the upper substrate 140. Spacers 104 are provided on the upwardly facing surfaces of microelectronic elements 136 or on the lower face of upper substrate 140, so as to hold the upper substrate above wire bonds 102. Spacers 104 desirably are formed from a dielectric material, and may include or consist of an adhesive layer. Here again, the interlayer connection terminals 129 of the lower substrate are connected to the interlayer connection pads 149 of the upper substrate by wire bonds 152. After wire-bonding, the assembly shown in FIG. 7 can be processed and handled in the same manner as discussed above with reference to FIGS. 4-6.

Figure 8:
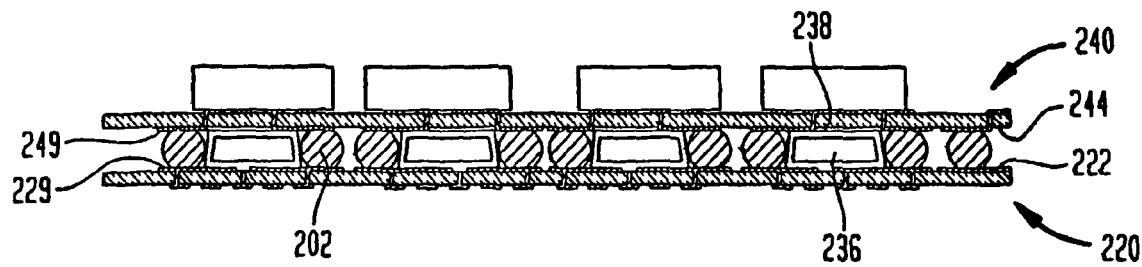
FIG. 8 is a diagrammatic section view depicting elements used in a process according to yet another embodiment of the invention.
Figure 9:
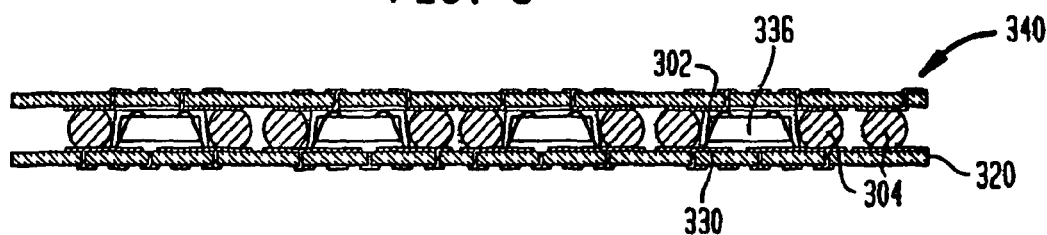
FIG. 9 is a view similar to FIGS. 7 and 8, but depicting elements used in a process according to a further embodiment of the invention.
Figure 10:
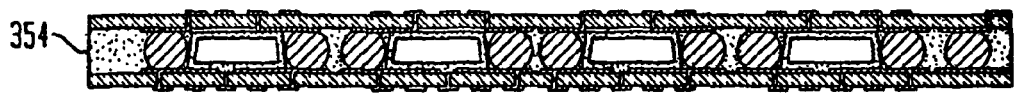
FIG. 10 is a view depicting the elements shown in FIG. 9 at a later stage of the process.
Figure 11:
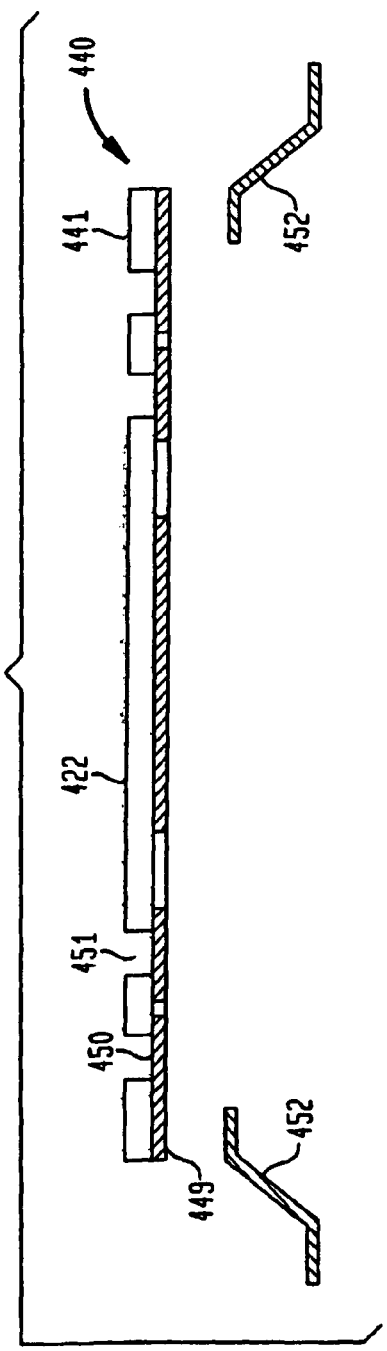
FIG. 11 is a diagrammatic view depicting a substrate and lead frame utilized in a process according to a further embodiment of the invention.

A process according to yet another embodiment of the invention again utilizes a lower substrate 220 and upper substrate 240 similar to those discussed above. Microelectronic elements 236 are mounted on the upper surface 222 of the lower substrate 220. Desirably, these microelectronic elements are covered by overmolding 238 around each microelectronic element. Here again, the microelectronic elements 236 may be packaged or unpacked elements. However, in the embodiment of FIG. 8, the interlayer connection terminals 229 of the lower substrate are exposed at the upper surface 222 of the substrate, whereas the interlayer connection terminals 249 of the upper substrate are exposed at the lower surface 244 of the upper substrate. These substrates are assembled with one another in a manner similar to that discussed above. However, electrically conductive spacing elements such as solder balls are positioned between the substrates on interlayer connection terminals, 229 of the lower substrate or 249 of the upper-substrate. When the substrates are assembled with one another, the conductive elements engage the interlayer connection terminals on the opposite substrate and are bonded thereto. Conductive elements 202, thus, provide both electrical connection between the substrates and physical spacing between the substrates. Additional microelectronic elements 256 may be mounted on the upper substrate before or after assembly. As in the other embodiments discussed above, the assembly steps serves to interconnect numerous regions of the upper substrate with numerous regions of the lower substrate in a single operation. As in the embodiments discussed above, the interconnected substrates can be severed so as to form individual units. An encapsulant (not shown) optionally may be injected between the substrates in the manner discussed above, desirably before severing the substrates. In a further variant (FIG. 9), the microelectronic elements 336 on the lower substrate 320 are unencapsulated "bare" semiconductor chips. These chips are wire-bonded to the conductive mounting components 330 of the lower substrate using wire bonds 302 similar to the wire bonds discussed above with reference to FIG. 7. The upper substrate 340 is assembled to the lower substrate and connected to the lower substrate by conductive elements 304 similar to those discussed above with reference to FIG. 8. Desirably, an encapsulant 354 (FIG. 10) is injected between the substrates prior to severing the substrates to form individual units. Conductive elements other than solder balls may be employed in the various embodiments. For example, as disclosed on PCT Published International Patent Application WO 2004/077525, the disclosure of which is hereby incorporated by reference herein, metallic conductive elements in the form of elongated bumps or pins may be used as inter-unit connections in a stack package. As set forth in U.S. Provisional Patent Application No. 60/583,066, filed Jun. 25, 2004, the disclosure of which is also incorporated by reference herein, pins of the types disclosed in co-pending, commonly assigned U.S. Provisional Patent Applications 60/533,210; 60/533,393 and 60/533,437, all filed Dec. 30, 2003, the disclosures of which are all hereby incorporated by reference herein, can be used as inter-unit connections in a stack package. Pins of these and other types can be used in the assemblies discussed above. One or both of the substrates may be provided with these pins prior to assembly, so that the pins are engaged with interlayer connection terminals on the opposite substrate.

Figure 12:
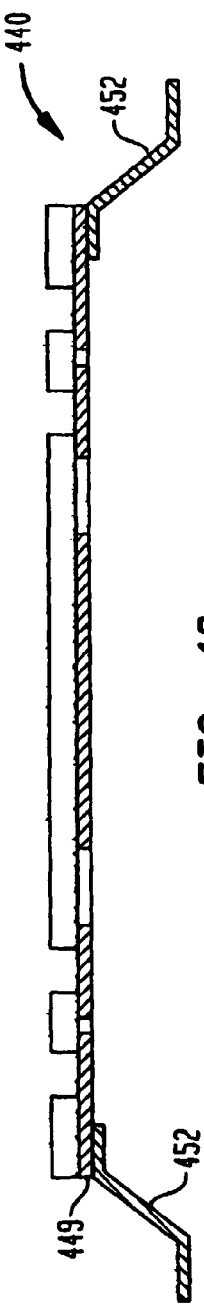
FIG. 12 is a view depicting the substrate and lead frame of FIG. 11 at a later stage in the process.
Figure 13:
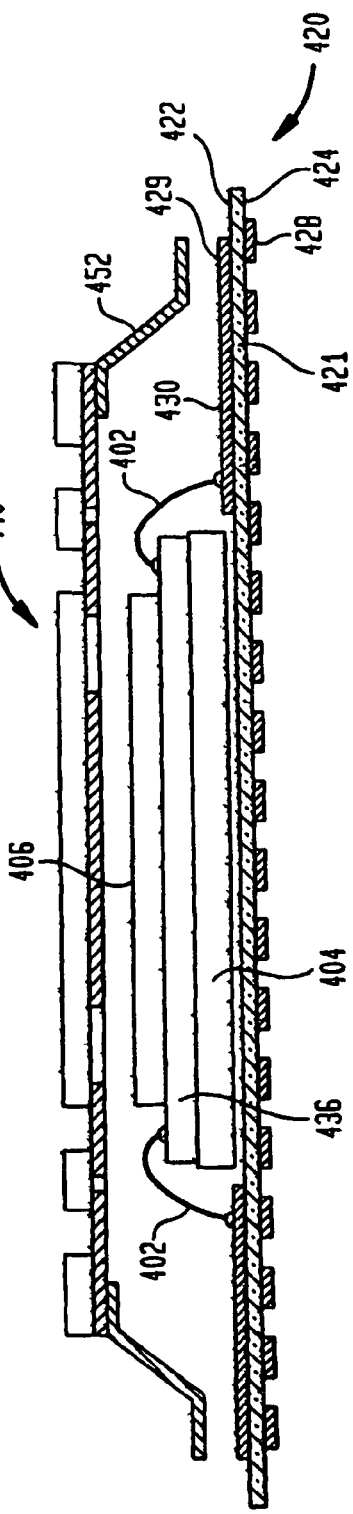
FIG. 13 is a diagrammatic sectional view depicting the elements shown in FIGS. 11 and 12 during a still later stage of the process.

A process according to yet another embodiment of the invention utilizes an upper substrate 440 in the form of a single metal tape incorporating a dielectric layer 421 with upper mounting terminals 450 and interlayer connection terminals 449 defined by a single layer of metallic features on the lower surface of the tape, the mounting 450 being exposed through holes 451 in the dielectric layer to upper surface 422 of the upper substrate. A lead frame including numerous leads 452 is attached to upper substrate 440 so that each lead 452 extends from one of the interlayer connection terminals 449, as seen in FIG. 12. Although only two leads 452 are depicted in the drawings, it should be appreciated that the lead frame includes numerous leads, and may also include a bus, bar or other elements to hold the leads in position relative to one another. Bus bars or other retaining elements may be removed after assembly of the lead frame with the upper substrate. A lead frame of the type taught in co-pending, commonly assigned U.S. patent application Ser. No. 10/746,810, filed Dec. 24, 2003, the disclosure of which is hereby incorporated by reference herein, may be utilized. The lead frame may be bonded to the interlayer connection terminals 449 of the upper substrate by processes such as solder-bonding, diffusion-bonding, thermocompression-bonding or the like. Alternatively, interlayer connection terminals 449 may be made in the form of tape-automated bonding ("TAB") leads, and these leads may be bonded to the lead frame using processes similar to those commonly used to bond TAB leads to elements such as semiconductor chips. As best seen in FIG. 12, the leads 452 of the lead frame project downwardly from the upper substrate 440. The process also utilizes a lower substrate 420 which has lower mounting terminals 428 exposed at its lower surface 424, and has electrical connections 430 exposed at its upper surface and interlayer connection terminals 429 also exposed at its upper surface 422. Here again, in the particular embodiment depicted in FIG. 13, the lower substrate is shown as a "two-metal" structure, but could be a single metal structure with various features exposed through holes in the dielectric element 421 of the lower substrate. A semiconductor chip or other microelectronic element 436 is mounted to lower substrate 420. In the embodiment depicted, the semiconductor chip 436 is mounted in face-up disposition and connected by wire bonds 402 to the connection terminals 430. However, chip 436 could also be mounted face-down. In a further variant, chip 436 could be a packaged chip or other packaged microelectronic element. In the particular embodiment depicted in FIG. 13, chip 436 is supported above the dielectric element 421 of the lower substrate by a spacer 404. In a further variant, spacer 404 could be replaced by a further semiconductor chip or other microelectronic element which may be mounted face-up or face-down. A spacer 406, desirably formed from a dielectric material, is disposed on the surface of microelectronic element 436 remote from lower substrate 420.

Figure 14:
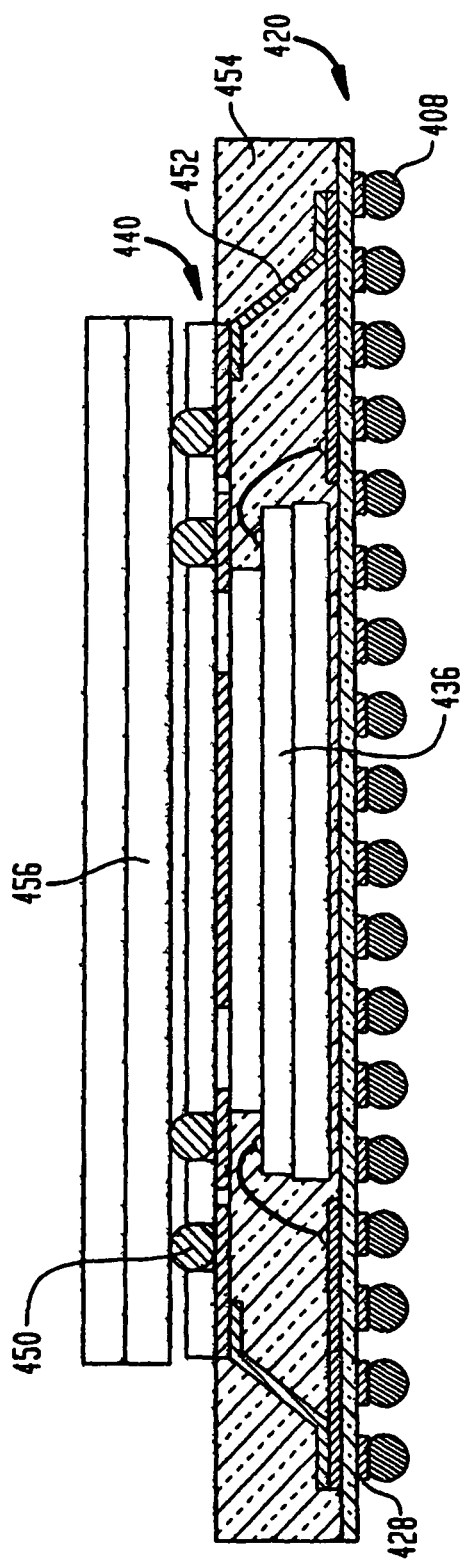
FIG. 14 is a diagrammatic sectional view depicting an assembly made using the elements of FIGS. 11-13.

The subassembly including the upper substrate 440 and leads 452 of the lead frame is mounted to the lower substrate by advancing the subassembly toward the lower substrate and bonding the lower ends of leads 452, remote from upper substrate 441 to the interlayer connection terminals 429 of the lower substrate using any of the techniques discussed above. After assembly of the upper and lower substrates, the resulting unit, including lower substrate 420, upper substrate 440, microelectronic element 436 and leads 452 connecting the upper and lower substrates, is encapsulated as, for example, by introducing a flowable encapsulant around the microelectronic element 436 and between substrates 420 and 440. The encapsulation process is conducted so as to leave upper mounting terminals 450 and lower mounting terminals 428 exposed and uncovered by the encapsulant 454. All of the steps discussed above with reference to FIGS. 11-14 may be conducted using individual upper and lower substrates and/or individual lead frames, or may be conducted while the upper substrate, the lower substrate, the lead frames or any combination of these are in the form of larger assemblies such as tapes or strips incorporating numerous substrates and/or numerous lead frames. In this case, the larger elements are severed as discussed above, so as to form individual units, each including a lower substrate, an upper substrate and one or more microelectronic elements 436. Here again, the larger units, before severance, can be handled, shipped and stocked as an article of commerce. Also, the individual units can be handled as such. Here again, a packaged or unpackaged additional microelectronic element 456 may be mounted to the upper mounting terminal as, for example, by solder-bonding, as seen in FIG. 14, or by wire-bonding. The lower mounting terminals 428 may be provided with electrically conductive bonding material such as solder balls 408 and may be used to mount the finished assembly to a circuit panel.

In each of the embodiments discussed above, the roles of the upper and lower substrates may be reversed. For example, the upper mounting terminals 450 of the assembly seen in FIG. 14 may be, used to mount the assembly to a circuit panel, whereas the lower mounting terminals 428 may be used to mount a further microelectronic element to the assembly. Also, the leads 452 of the lead frame may be assembled to the lower substrate rather than the upper substrate. In yet a further embodiment, the entire upper substrate may consist solely of, elements from a lead frame. The bus bars or other parts of the lead frame which serve to interconnect the various leads and form a self-supporting lead frame may be removed after encapsulation. Conversely, the lower substrate 420 may be replaced by elements of the lead frame. In one variant, the ends of the lead frame remote from the upper substrate are exposed so that these ends serve as the lower mounting terminals of the assembly.

As used in this disclosure, terms such as "upper," "lower," "upwardly" and "downwardly," and similar terms denoting directions, refer to the frame of reference of the components themselves, rather than to the gravitational frame of reference. With the parts oriented in the gravitational frame of reference in the directions shown in the figures, with the top of drawing being up and the bottom of the drawing being down in the gravitational frame of reference, the upper substrate is, indeed, above the lower substrate in the gravitational frame of reference. However, when the parts are turned over, with the top of the drawing facing downwardly in the gravitational frame of reference, the upper substrate is below the lower substrate in the gravitational frame of reference.

The foregoing descriptions of the preferred embodiments are intended to illustrate rather than to limit the present invention.

As these and other variations and combinations of the features discussed above can be utilized without departing from the present invention as defined by the claims, the foregoing description of the preferred embodiments should be taken by way of illustration rather than by way of limitation of the invention as defined by the claims.

The invention claimed is:

1. An in-process unit including upper and lower dielectric substrates and a plurality of microelectronic elements disposed between said upper and lower dielectric substrates, each said microelectronic element comprising a semiconductor chip, each of said upper and lower dielectric substrates including a plurality of regions, each region of said upper dielectric substrate being aligned with a corresponding region of the lower dielectric substrate with at least one said microelectronic element disposed therebetween, each of said regions of said upper and lower dielectric substrates having electrically conductive elements thereon, said in-process unit further including wire bonds having first ends joined to at least some of said conductive elements of each said region of said upper dielectric substrate and second ends joined to the electrically conductive elements of the corresponding region of said lower dielectric substrate, said wire bonds electrically connecting said regions of said upper substrate with said corresponding regions of said lower substrates such that each said wire bond has a first end joined to one said conductive element of one said region of said upper dielectric substrate and has a second end joined to one said conductive element of one said region of said lower dielectric substrate.

2. An in-process unit as claimed in claim 1 further comprising an encapsulant disposed at least between said upper and lower dielectric substrates.

3. An in-process unit, comprising:
   a lower dielectric substrate having a plurality of regions;
   a plurality of upper dielectric substrates, each aligned with a respective region of said lower dielectric substrate; and
   a plurality of microelectronic elements each comprising a semiconductor chip, each microelectronic element disposed between one of said upper dielectric substrates and said respective region of said lower dielectric substrate,
   each of said upper dielectric substrates and said regions of said lower dielectric substrate having electrically conductive elements thereon, said in-process unit further comprising wire bonds having first ends joined to at least some of said conductive elements of each said upper substrate and second ends joined to said electrically conductive elements of said respective region of said lower substrate, said wire bonds electrically connecting said conductive elements of said upper dielectric substrates with said respective regions of said lower dielectric substrate such that each said wire bond has a first end joined to one said conductive element of one of said upper dielectric substrates and has a second end joined to one said conductive element of one said region of said lower dielectric substrate.

4. An in-process unit as claimed in claim 3 further comprising an encapsulant disposed at least between each said upper dielectric substrate and said respective region of said lower dielectric substrate.

5. An in-process unit, comprising:
   an upper dielectric substrate having a plurality of regions;
   a plurality of lower dielectric substrates, each aligned with a respective region of said upper dielectric substrate; and
   a plurality of microelectronic elements, each disposed between one of said lower dielectric substrates and said respective region of said upper dielectric substrate, each said microelectronic element comprising a semiconductor chip,
   each of said lower dielectric substrates and said regions of said upper dielectric substrate having electrically conductive elements, said in-process unit having a plurality of wire bonds electrically connecting at least some of said conductive elements of each said lower dielectric substrate with said electrically conductive elements of said respective region of said upper dielectric substrate such that each said wire bond has a first end joined to one said conductive element of said upper dielectric substrate and has a second end joined to one said conductive element of one of said lower dielectric substrates.

6. An in-process unit as claimed in claim 5 further comprising an encapsulant disposed at least between each said lower dielectric substrate and said respective region of said upper dielectric substrate.

\* \* \* \* \*